US011068084B2

(12) United States Patent
Yoshihara

(10) Patent No.: US 11,068,084 B2
(45) Date of Patent: Jul. 20, 2021

(54) INPUT DEVICE

(71) Applicant: Panasonic Intellectual Property Management Co., Ltd., Osaka (JP)

(72) Inventor: Satoshi Yoshihara, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/637,931

(22) PCT Filed: Nov. 2, 2018

(86) PCT No.: PCT/JP2018/040792
§ 371 (c)(1),
(2) Date: Feb. 10, 2020

(87) PCT Pub. No.: WO2019/098055
PCT Pub. Date: May 23, 2019

(65) Prior Publication Data
US 2020/0174586 A1    Jun. 4, 2020

(30) Foreign Application Priority Data

Nov. 20, 2017  (JP) .............................. JP2017-222382

(51) Int. Cl.
*G06F 3/0362* (2013.01)
*G06F 3/02* (2006.01)
(Continued)

(52) U.S. Cl.
CPC .............. *G06F 3/0362* (2013.01); *G06F 3/02* (2013.01); *G06F 3/03547* (2013.01);
(Continued)

(58) Field of Classification Search
CPC .......... G06F 3/044; G06F 3/0362; G06F 3/02; G06F 3/03547; H01H 25/00; H01H 25/04; H01H 89/00
(Continued)

(56) References Cited

U.S. PATENT DOCUMENTS

| 2008/0006453 A1* | 1/2008 | Hotelling | G06F 3/044 |
| | | | 178/18.06 |
| 2017/0052617 A1* | 2/2017 | Okuzumi | G05G 1/10 |

(Continued)

FOREIGN PATENT DOCUMENTS

| JP | 2016-149306 | 8/2016 |
| JP | 2016-218892 | 12/2016 |

(Continued)

OTHER PUBLICATIONS

International Search Report of PCT application No. PCT/JP2018/040792 dated Dec. 18, 2018.

*Primary Examiner* — Jimmy H Nguyen
(74) *Attorney, Agent, or Firm* — McDermott Will & Emery LLP

(57) ABSTRACT

An input device includes a rotary part having an opening, a pressing member configured to transmit light through a first region, a rotary electrode part including a first electrode element, a holding electrode part including a second electrode element that is configured to be brought into contact with and separated from the first electrode element by rotation of the rotary electrode part, a first detection electrode part disposed so as to face the holding electrode part, and a substrate in which the first detection electrode part is disposed. The substrate and the pressing member transmit light through the first region.

4 Claims, 11 Drawing Sheets

(51) Int. Cl.
*G06F 3/0354* (2013.01)
*G06F 3/044* (2006.01)
*H01H 25/04* (2006.01)
*H01H 89/00* (2006.01)

(52) U.S. Cl.
CPC ............. *G06F 3/044* (2013.01); *H01H 25/04* (2013.01); *H01H 89/00* (2013.01)

(58) Field of Classification Search
USPC ................................ 345/173, 174, 184, 156
See application file for complete search history.

(56) References Cited

U.S. PATENT DOCUMENTS

| | | |
|---|---|---|
| 2017/0316901 A1 | 11/2017 | Sawada et al. |
| 2018/0046267 A1 | 2/2018 | Kobayashi |

FOREIGN PATENT DOCUMENTS

| | | |
|---|---|---|
| WO | 2016/075907 | 5/2016 |
| WO | 2016/170908 | 10/2016 |

* cited by examiner

FIG. 6
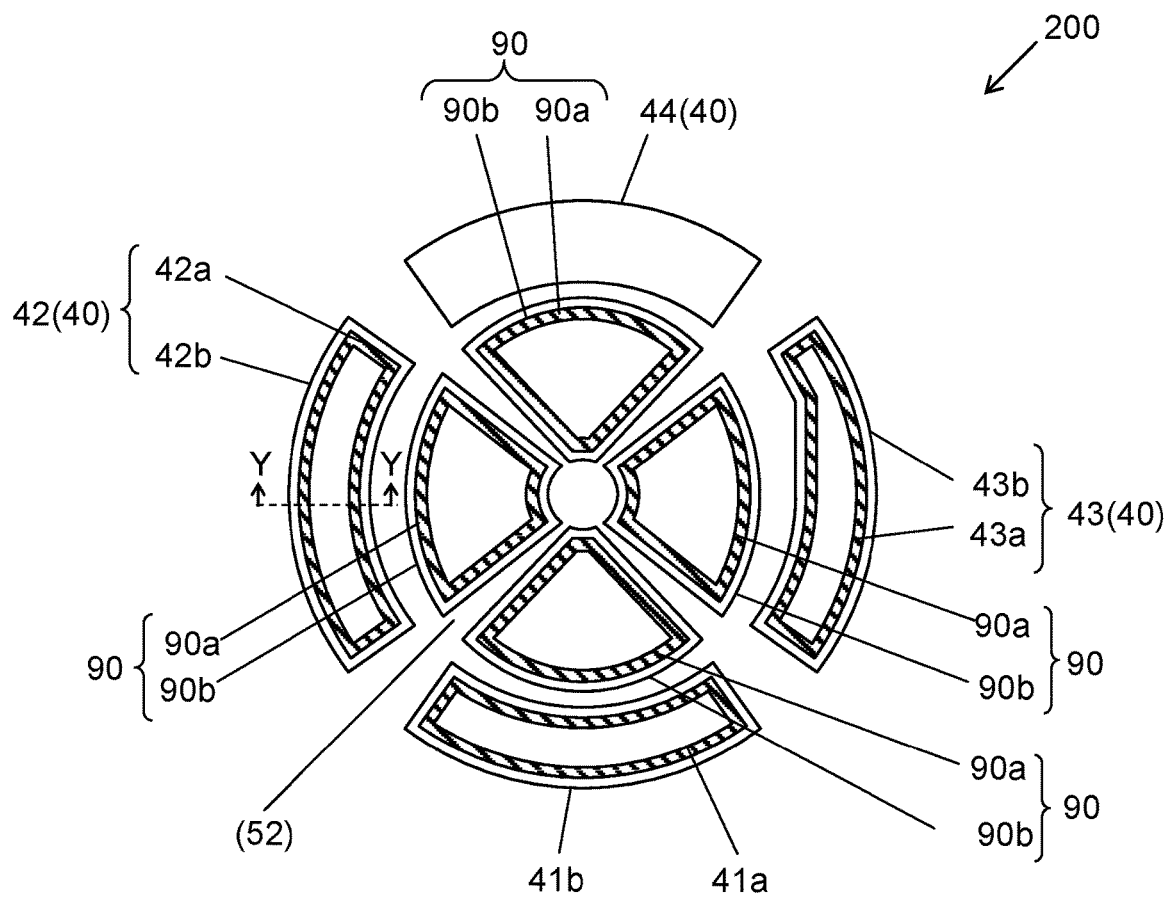
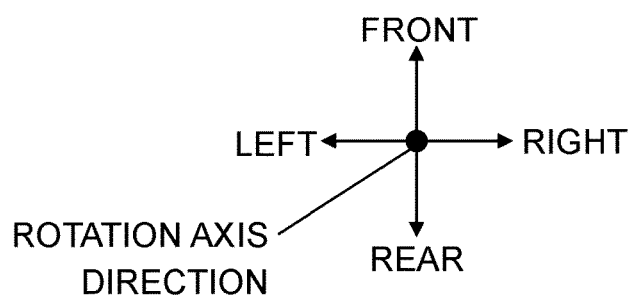

INPUT DEVICE

CROSS-REFERENCE TO RELATED APPLICATIONS

This application is a U.S. national stage application of the PCT International Application No. PCT/JP2018/040792 filed on Nov. 2, 2018, which claims the benefit of foreign priority of Japanese patent application No. 2017-222382 filed on Nov. 20, 2017, the contents all of which are incorporated herein by reference.

TECHNICAL FIELD

The present disclosure relates to an input device used to make an input into an electronic device of every kind.

BACKGROUND ART

A conventional input device includes an input unit and a detection unit.

The input unit includes an input part, a rotary electrode part, and a holding electrode part. The input part includes a rotary part configured to rotate. The rotary electrode part rotates in response to rotation of the rotary part. The holding electrode part is disposed to face the rotary electrode part. An electric state between the holding electrode part and the rotary electrode part changes by rotation of the rotary electrode part.

The detection unit includes a first detection electrode part and a substrate. The substrate has an electronic circuit, and an electronic component is disposed on the substrate. The first detection electrode part is formed on a surface of the substrate opposed to a surface where the electronic circuit is formed. The first detection electrode part is disposed to face the holding electrode part. Electrostatic capacitance of the first detection electrode part changes by rotation of the rotary part.

As such a conventional input device, an input device disclosed in PTL 1 is known, for example.

CITATION LIST

Patent Literature

PTL 1: Unexamined Japanese Patent Publication No. 2016-218892

SUMMARY OF THE INVENTION

An input device according to an aspect of the present disclosure includes a rotary part having an opening, a pressing member disposed so as to overlap the opening of the rotary part in a plan view, a rotary electrode part including a first electrode element, and a holding electrode part including a second electrode element. The pressing member transmits light through a first region overlapping the opening of the rotary part in the plan view. The rotary electrode part rotates in response to rotation of the rotary part. At least part of the second electrode element is disposed so as to face the rotary electrode part. The second electrode element is configured to be brought into contact with and separated from the first electrode element by rotation of the rotary electrode part. The input device further includes a first detection electrode part disposed so as to face the holding electrode part and a substrate in which the first detection electrode part is disposed. The first detection electrode part includes a first reception electrode disposed so as to overlap the second electrode element in the plan view and a first transmission electrode disposed so as to overlap the first reception electrode in the plan view. Electrostatic capacitance between the first reception electrode and the first transmission electrode changes by the rotation of the rotary electrode part. The substrate and the pressing member transmit light through the first region.

This configuration enables the input device of the present disclosure to transmit light incident from a first direction through the first region to a point in a second direction opposite the first direction.

BRIEF DESCRIPTION OF DRAWINGS

FIG. 6 is a schematic view of a detection unit according to the present disclosure.

DESCRIPTION OF EMBODIMENT

Recently, there has been demand for a display apparatus that includes a display disposed at a place farther in a first direction (downward) than an input device and that enables viewing of a content or other information shown in the display through the input device when the input device is viewed from a point in a second direction (upward) opposite the first direction.

In the conventional input device described above, the electronic component and the first detection electrode part are disposed on the same substrate and thus the substrate includes an opaque board such as a printed circuit board. As a result, light that is incident on the input device from a point farther in a first direction (downward) than the input device is less likely to be transmitted to a point farther in a second direction (upward) than the input device.

In the present disclosure, an exemplary embodiment will be described with the first direction defined as "down" and the second direction defined as "up" to facilitate understanding.

In other words, there has been demand for an input device that enables viewing of information shown in a display positioned downward of the input device when a user views the input device from a point located upward. To put it another way, there has been demand for an input device that allows light incident on the input device from a point located downward to be transmitted upward of the input device.

In the description given hereinafter, the first direction is "down" and the second direction is "up". However, the "first direction" and the "second direction" may be any directions opposite to each other.

In the present disclosure, the description is given by using terms indicating directions of "up", "down", "right", "left", "upward", "downward" and the like. However, these terms merely show the relative positional relationship of constitutional elements, and should not be construed to limit the scope of the present disclosure.

(Exemplary Embodiment)

[Outline of Display Apparatus 2000]

Figure 1:
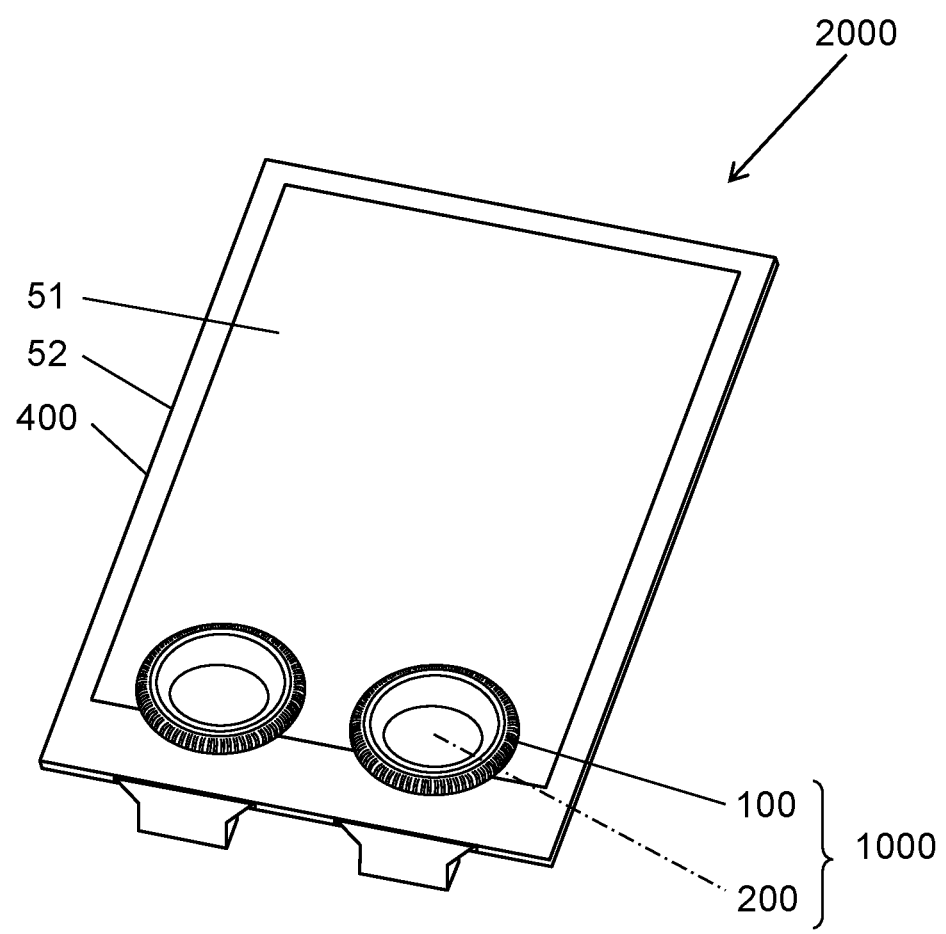
FIG. 1 is a perspective view of a display apparatus according to the present disclosure.
Figure 2:
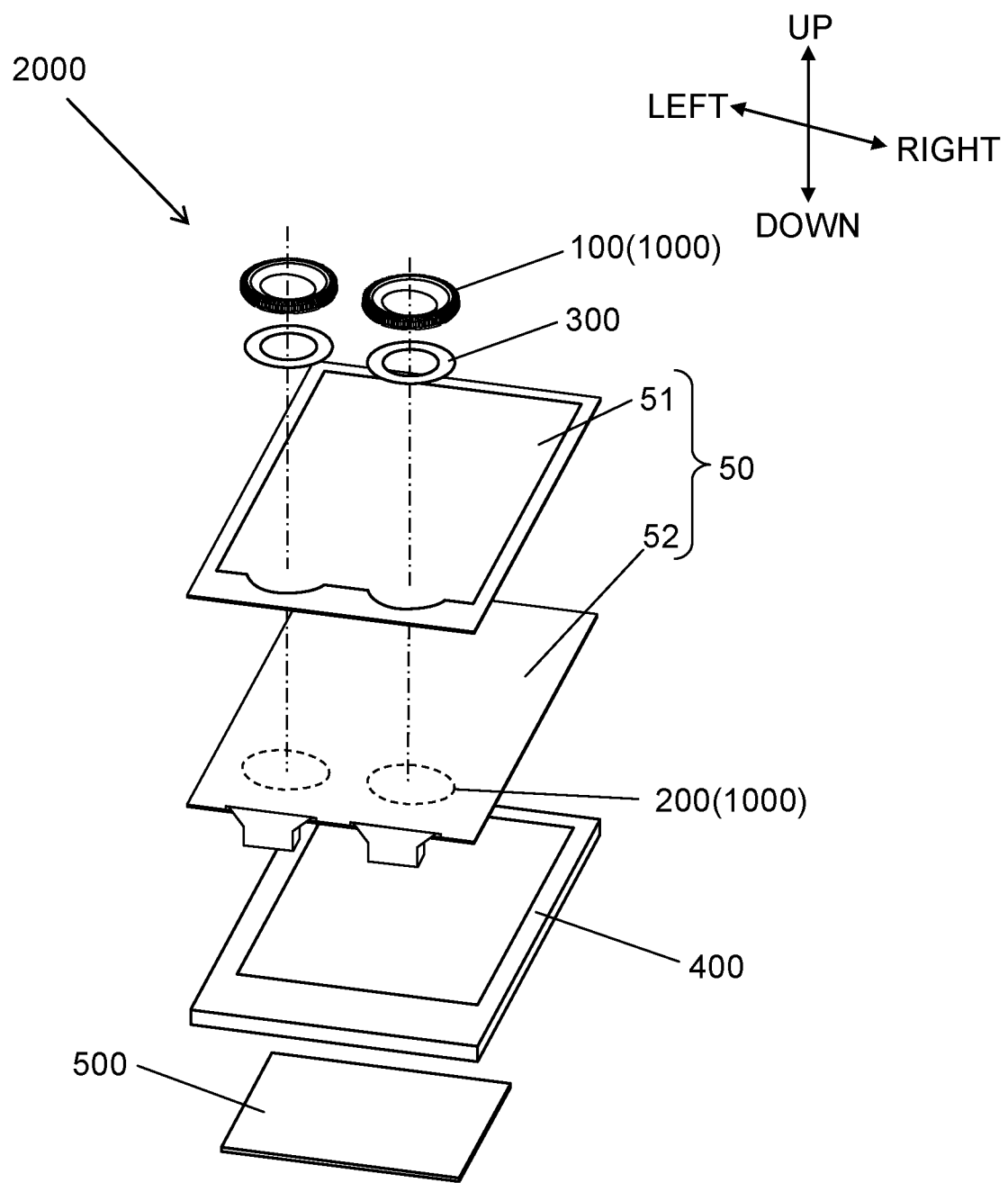
FIG. 2 is an exploded perspective view of a display apparatus according to the present disclosure.

With reference to FIGS. 1 and 2, a configuration of display apparatus 2000 will be described. FIG. 1 is a perspective view of display apparatus 2000. FIG. 2 is an exploded perspective view of display apparatus 2000. Examples of display apparatus 2000 include touch screens. Display apparatus 2000 includes cover 51, electrode substrate 52, and display 400. Controller 500 (see FIG. 2) is disposed below display 400. Display apparatus 2000 has input device 1000. Input device 1000 includes input unit 100 fastened to cover 51 with fastening member 300 and detection unit 200 formed in electrode substrate 52. Input device 1000 is configured to allow light that is emitted upward from display 400 disposed below detection unit 200 (described in detail later) to pass through input unit 100 and detection unit 200.

[Outline of Input Unit 100]

Figure 3:
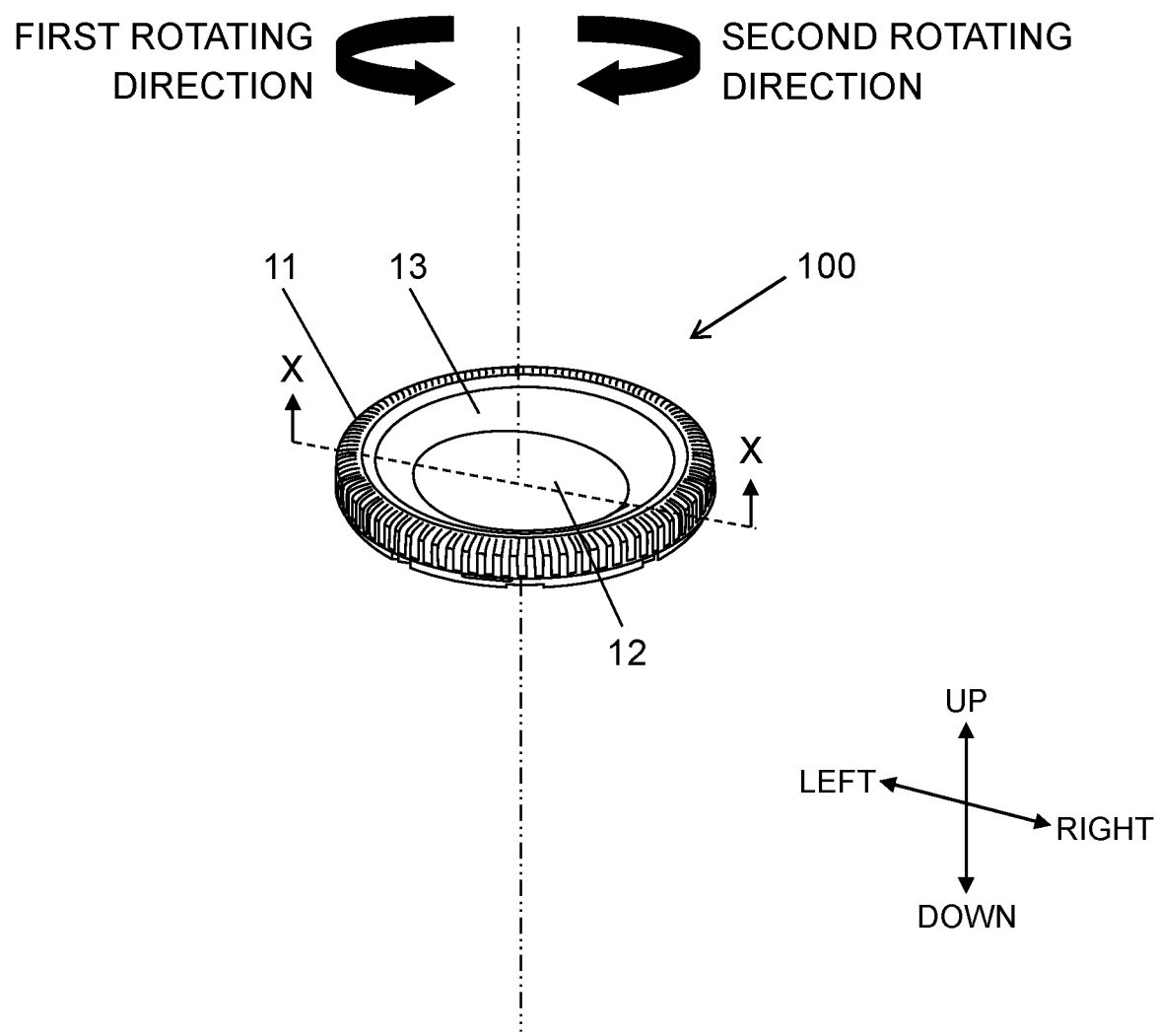
FIG. 3 is a perspective view of an input unit according to the present disclosure.
Figure 4:
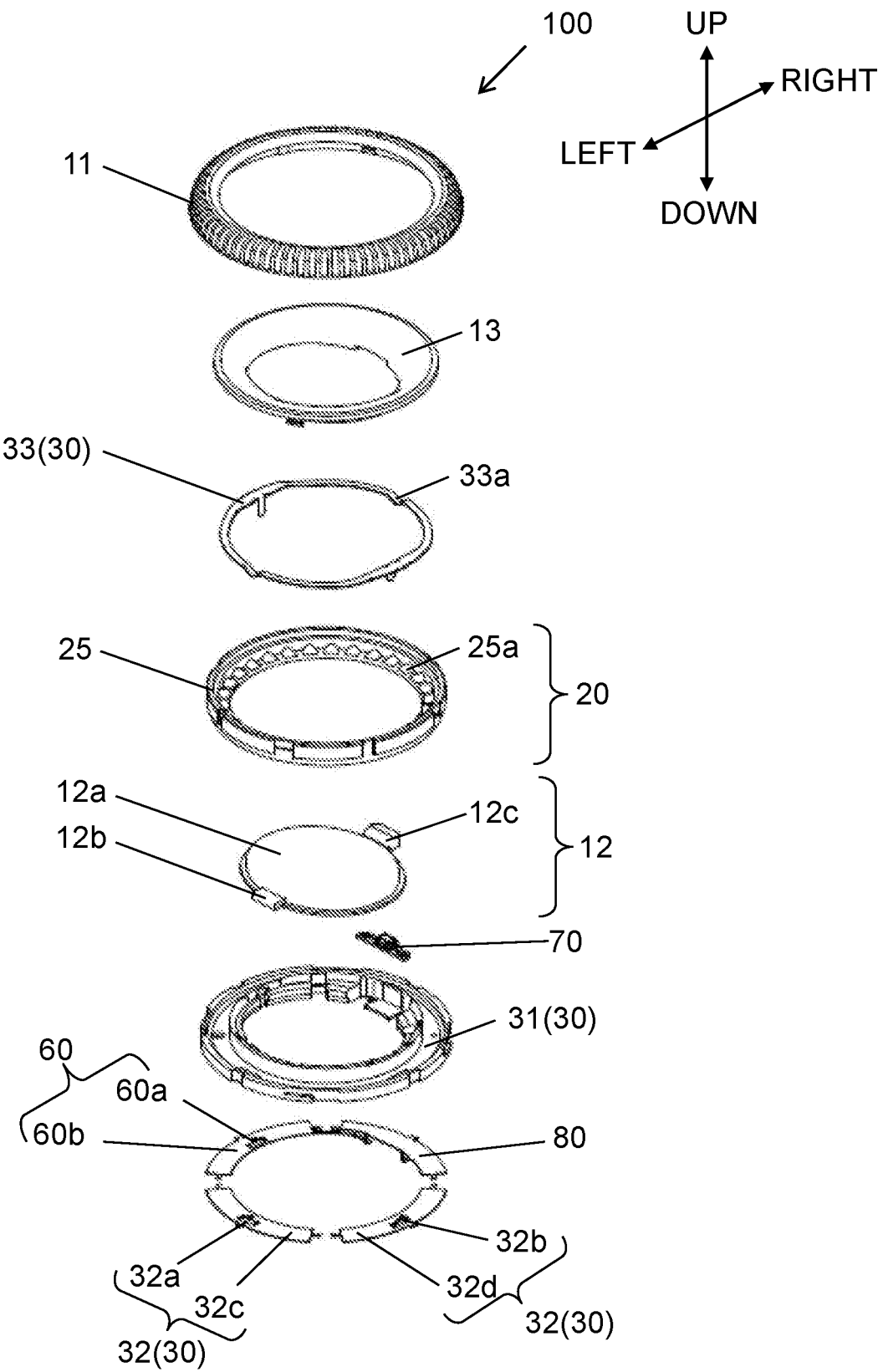
FIG. 4 is an exploded perspective view of the input unit shown in FIG. 3.
Figure 5:
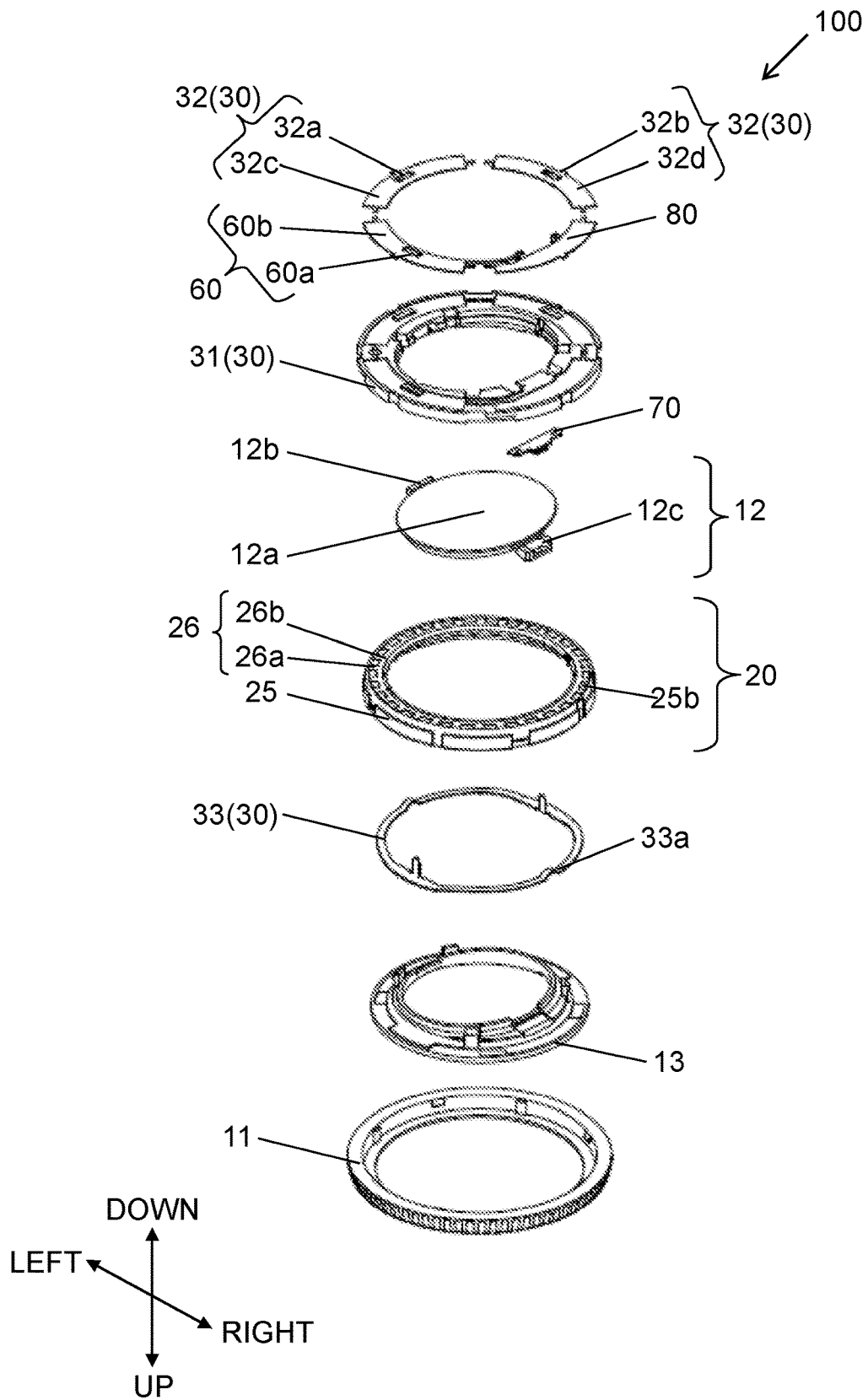
FIG. 5 is an exploded perspective view of the input unit shown in FIG. 3.

With reference to FIGS. 3 to 5, input unit 100 will be described. FIG. 3 is a perspective view of input unit 100. FIG. 4 is an exploded perspective view of input unit 100 viewed from up above. FIG. 5 is an exploded perspective view of input unit 100 viewed from down below. As described above, input device 1000 includes input unit 100 and detection unit 200 that is disposed below input unit 100. Detection unit 200 will be described later with reference to FIG. 6 and the like.

As shown in FIG. 3, input unit 100 includes rotary part 11, pressing member 12, and guide 13. Rotary part 11 rotates in response to force applied by a physical object such as a user, a robot, and a mechanism. Pressing member 12 is disposed inside an outer edge of rotary part 11. As shown in FIG. 4, pressing member 12 includes main body 12a, holder 12b, and pressing part 12c. Light is allowed to pass through at least main body 12a.

Rotary electrode part 20 is disposed below rotary part 11. Rotary electrode element 26 (see FIG. 5) is formed in a lower surface of rotary electrode part 20 so as to be exposed to an outside. Rotary electrode element 26 (see FIG. 5) rotates by rotation of rotary part 11.

A method for forming rotary electrode element 26 will now be described briefly. A metal is inserted in the lower surface of rotary electrode part 20, which is made entirely of a resin, such that the metal is exposed out of the resin. As a result, as shown in FIG. 5, of the lower surface of rotary electrode part 20, a part where the metal is exposed corresponds to rotary electrode element 26 and the remaining part represents resin 25b.

Rotary electrode part 20 is disposed above holding member 31. Holding electrode part 30, reference electrode part 60, and pressing electrode part 80 are disposed below holding member 31. In other words, holding electrode element 32 (holding electrode part 30) and rotary electrode element 26 are disposed so as to face each other through holding member 31. An electric state between holding electrode element 32 and rotary electrode element 26 changes by rotation of rotary electrode part 20.

[Outline of Detection Unit 200]

Figure 7:
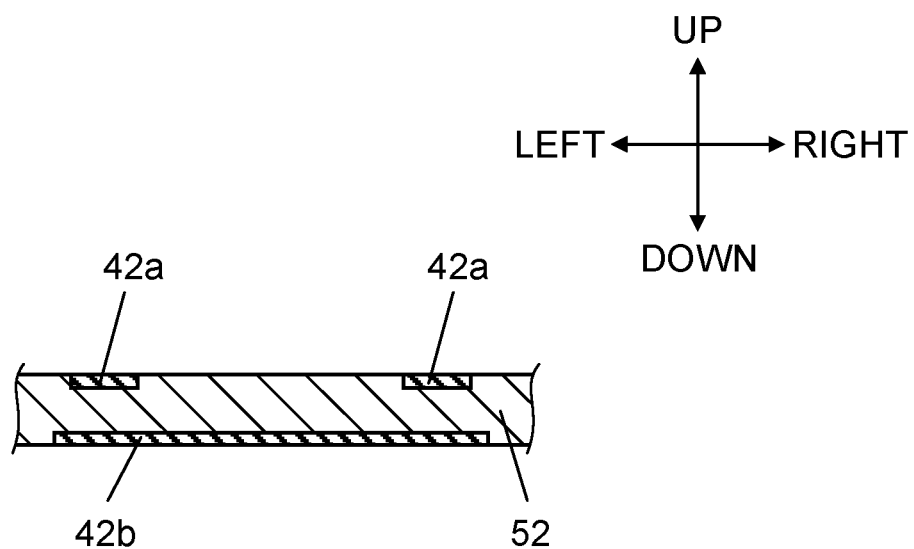
FIG. 7 is a partial cross-sectional view of the detection unit taken along line Y-Y in FIG. 6.

Next, with reference to FIGS. 6 and 7, an outline of detection unit 200 will be described. FIG. 6 is a schematic view of detection unit 200 according to the present disclosure. FIG. 7 is a partial cross-sectional view of detection unit 200 taken along line Y-Y in FIG. 6.

As described later with reference to FIG. 8 and the like, detection unit 200 is formed in electrode substrate 52. Cover 51 is layered on the electrode substrate where detection unit 200 is formed. In FIG. 6, electrode substrate 52 and cover 51 are not shown.

As shown in FIG. 6, detection unit 200 includes first detection electrode part 40 positioned at a periphery and second detection electrode part 90 positioned at a middle.

First detection electrode part 40 includes detection electrode element 41 made up of a pair of reception electrode 41a and transmission electrode 41b, detection electrode element 42 made up of a pair of reception electrode 42a and transmission electrode 42b, and detection electrode element 43 made up of a pair of reception electrode 43a and transmission electrode 43b. Second detection electrode part 90 includes four pairs of reception electrodes 90a and transmission electrodes 90b.

As shown in FIG. 7, reception electrode 42a is disposed in an upper surface of electrode substrate 52, and transmission electrode 42b is disposed in a lower surface of electrode substrate 52. Reception electrode 42a and transmission electrode 42b are opposed to each other in an up-down direction. In this way, a positional relationship between reception electrode 42a and transmission electrode 42b is described. The same applies to a positional relationship between reception electrode 41a and transmission electrode 41b and to a positional relationship between reception electrode 43a and transmission electrode 43b.

[Configuration of Input Device 1000]

Next, with reference to FIGS. 3 to 8, a configuration of input device 1000 will be described.

Figure 8:
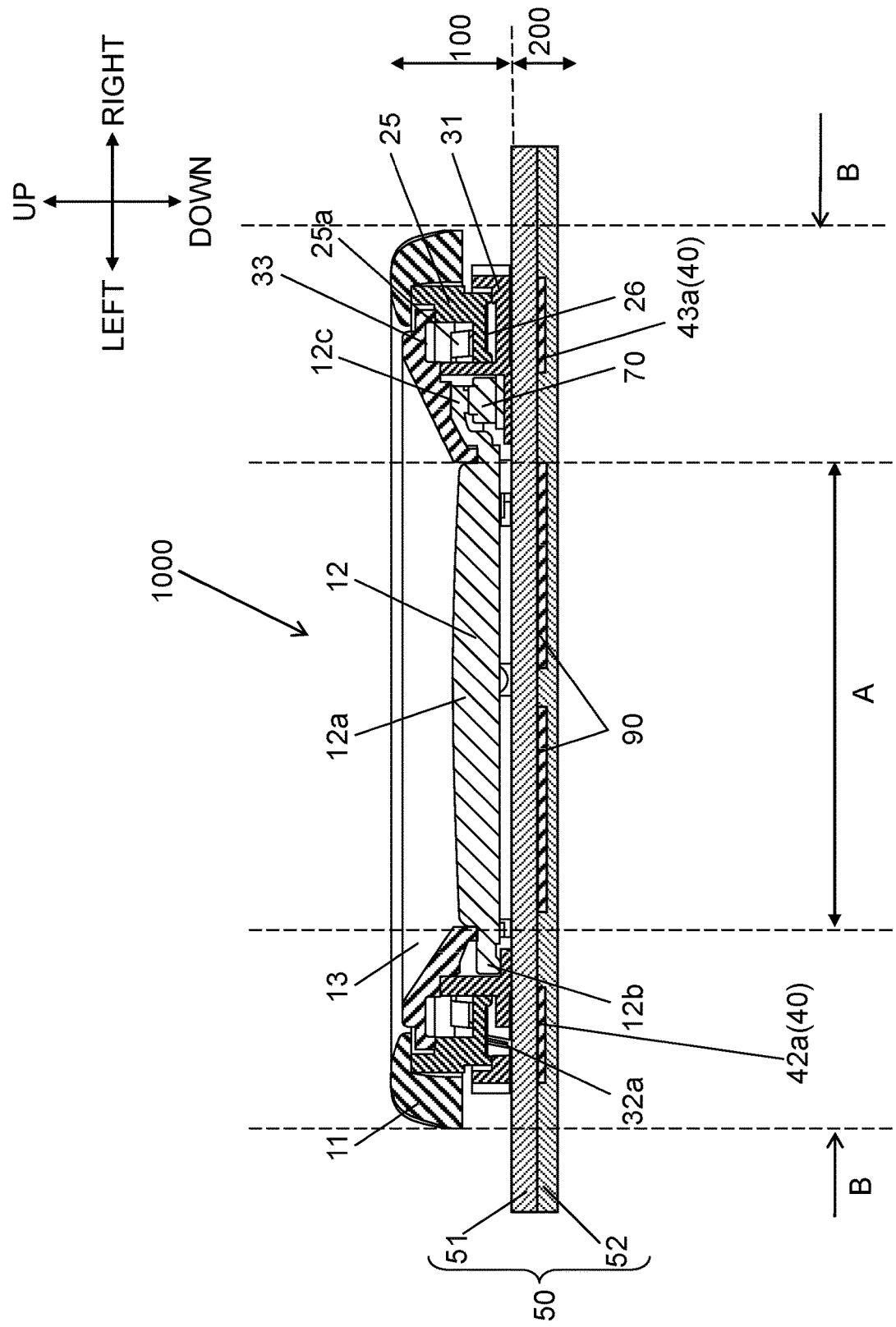
FIG. 8 is a schematic view illustrating a cross section of the display apparatus.

FIG. 8 is a schematic view illustrating a cross section of the display apparatus show in FIG. 1. In input device 1000 according to the present disclosure, as shown in FIG. 8, detection unit 200 is disposed below input unit 100. In FIG. 8, the input device especially detection unit 200 is shown only schematically. For example, components such as transmission electrodes 42b, 43b are not shown.

Positional relationships between the electrodes in input unit 100 and the electrodes in detection unit 200 will now be described.

Detection electrode element 42 (see FIG. 6) is positioned below pressing electrode part 80 (see FIG. 4), and detection electrode elements 41, 42 (see FIG. 6) are positioned below two holding electrode elements 32 (see FIG. 4). Reception electrode part 44 (see FIG. 6) is positioned below reference electrode part 60 (see FIG. 4).

Reception electrode 41a and transmission electrode 41b (or reception electrode 42a and transmission electrode 42b) are put into capacitive coupling. Electrostatic capacitance between reception electrode 41a and transmission electrode 41b (or reception electrode 42a and transmission electrode 42b) changes by rotation of rotary part 11.

A configuration of electrode substrate 52 will now be described in detail.

As shown in FIG. 8, first detection electrode part 40 (reception electrode 41a, transmission electrode 41b, reception electrode 42a, transmission electrode 42b, reception electrode 43a, transmission electrode 43b, and reception electrode part 44) is formed in substrate 50. In substrate 50, a region (first region A) facing main body 12a (a transmissive part) of pressing member 12 transmits light (see FIG. 8).

In this way, input device 1000 has pressing member 12 that is disposed inside the outer edge of rotary part 11 and that transmits light and substrate 50 that transmits light through first region A facing pressing member 12. In the present disclosure, substrate 50 includes cover 51 and electrode substrate 52. This configuration allows light that is incident on first region A from a place downward of substrate 50 to pass through substrate 50 and pressing member 12 and travel toward a place upward of pressing member 12. Hence, input device 1000 allows an object positioned below substrate 50 to be viewed through pressing member 12 and substrate 50.

As shown in FIG. 1, input device 1000 includes input unit 100 and detection unit 200. As described above, input device 1000 is configured to allow light that is incident from a place downward of detection unit 200 to be transmitted toward a place upward of input unit 100. Input device 1000 accepts mechanical inputs via input unit 100. The mechanical inputs are, for example, rotation, pressing, pulling, and sliding. Detection unit 200 converts at least one of the inputs via input unit 100 into a change in electrostatic capacitance.

[Configuration of Input Unit 100]

Next, with reference to FIGS. 2 to 5, input unit 100 will be described. FIG. 4 is an exploded perspective view of input unit 100 shown in FIG. 3, viewed from up above. FIG. 5 is an exploded perspective view of input unit 100 shown in FIG. 3, viewed from down below. Input unit 100 includes rotary part 11, rotary electrode part 20 including rotary electrode element 26, holding electrode part 30 including two holding electrode elements 32, reference electrode part 60, switch 70, and pressing electrode part 80. Input unit 100 includes rotary part 11, pressing member 12, and guide 13.

Rotary part 11 is shaped into a ring that has a circular outer edge and a circular inner edge. Rotary part 11 is held by holding member 31 so as to be rotatable. Pressing member 12 and guide 13 are disposed inside the inner edge of rotary part 11.

The ring shape of rotary part 11 may be a polygon. For example, the rotary part may be shaped into a ring that has a polygonal outer edge and a polygonal inner edge. The ring shape of rotary part 11 may be such that an inner edge shape and an outer edge shape do not match. For example, rotary part 11 may be shaped into a ring that has a polygonal outer edge and a circular inner edge or may be shaped into a ring that has a circular outer edge and a polygonal inner edge. The inner and the outer edges of rotary part 11 do not necessarily look perfectly circular or polygonal. The ring shape may be formed by combining a curved line and a straight line. For example, the inner and the outer edges of rotary part 11 may each have the shape of an ellipse, a rough circle, or a rough polygon having curved corners. Rotary part 11 may be shaped into any form that has an opening.

Pressing member 12 includes main body 12a, holder 12b, and pressing part 12c. Main body 12a, for example, contains a material, such as glass, polycarbonate, polystyrene, or acrylic, and is transparent and able to transmit light. Main body 12a is disposed inside the inner edge of rotary part 11. In other words, the opening of rotary part 11 and pressing part 12c overlap each other in plan view. The main body is situated at a place that is visible when an area inside the ring of rotary part 11 is viewed from a point upward of rotary part 11 (when viewed downward from a place upward of rotary part 11). In other words, main body 12a is positioned inside the inner edge of rotary part 11 and is exposed out of input device 1000. To put it another way, main body 12a is inside an inner edge of guide 13 and is exposed out of input device 1000.

The main body may be colored transparent or colorless transparent. Main body 12a may be transparent to such an extent that visible light incident on the main body from a lower position can be viewed from an upper position. Thus, main body 12a may be designed to reflect light incident from an upper position and transmit light incident from a lower position. In other words, main body 12a may be, for example, a one-way mirror.

Pressing part 12c protrudes from main body 12a. Pressing part 12c is disposed above switch 70. Guide 13 is disposed above pressing part 12c. In other words, pressing part 12c is disposed between guide 13 and switch 70.

Pressing part 12c may be made of a material identical to the material that main body 12a is made of. Pressing part 12c may be transparent or opaque. Pressing part 12c may be integrated with or be separable from main body 12a.

Holder 12b protrudes from main body 12a. Holder 12b is disposed to face pressing part 12c through main body 12a. Holder 12b is held between an upper surface of holding member 31 and a lower surface of guide 13. Holder 12b is held such that pressing part 12c is movable upward and downward.

Holder 12b may be made of a material identical to the material that main body 12a and pressing part 12c are made of. Holder 12b may be transparent or opaque. Holder 12b may be integrated with or be separable from main body 12a.

Guide 13 is disposed inside the ring of rotary part 11. Guide 13 is disposed above pressing member 12 (main body 12a). Guide 13 has a ring shape. Guide 13 has a slope that slants upward along with an advancement from a rotational center of rotary part 11 toward an outside of rotary part 11.

Rotary electrode part 20 includes rotary part 25 and rotary electrode element 26 (a first electrode element). Rotary part 25 is ring-shaped and tubular. Rotary part 25 is made of a resin having an insulation property. An upper surface of rotary part 25 includes uneven area 25a having a plurality of recesses and a plurality of protrusions. Rotary electrode element 26 is held in a lower surface of rotary part 25. Rotary electrode element 26 is a ring-shaped electric conductor including outer peripheral part 26a (see FIG. 5) and inner peripheral part 26b (see FIG. 5) that is positioned nearer to an inner edge of rotary electrode part 20 than outer peripheral part 26a is. The outer peripheral part includes cutouts formed at regular intervals. Thus, rotary part 25 is exposed at the cutouts of rotary electrode element 26, and exposed areas of rotary part 25 are shown as resin 25b.

Holding electrode part 30 includes holding member 31, holding electrode elements 32, and click spring 33. Holding member 31 is ring-shaped and tubular. Holding member 31 has a plurality of holes that pass through from a lower surface to an upper surface of the holding member. Holding member 31 holds rotary part 25 such that the rotary part is allowed to rotate. Holding electrode elements 32 are held on the lower surface of holding member 31.

Holding electrode elements 32 are disposed to face rotary electrode element 26. One of holding electrode elements 32 has brush 32a and body 32c, and the other of holding electrode elements 32 has brush 32b and body 32d. Brush 32a and body 32c are electric conductors that are molded and integrated together. Brush 32b and body 32d are electric conductors that are molded and integrated together. Brush 32a and brush 32b protrude upward through the respective corresponding holes formed in holding member 31 and are each put into contact with outer peripheral part 26a or rotary part 25 (resin 25b) of rotary electrode element 26. Body 32c and body 32d are held on the lower surface of holding member 31.

Click spring 33 includes contact pressure part 33a. Click spring 33 is a ring-shaped metal body, and contact pressure part 33a has elasticity. Click spring 33 is held by holding member 31 such that contact pressure part 33a is put into contact with uneven area 25a.

Reference electrode part 60 has brush 60a and body 60b. Brush 60a and body 60b are electric conductors that are molded and integrated together. Reference electrode part 60 is held on the lower surface of holding member 31. Brush 60a is put into contact with inner peripheral part 26b of rotary electrode element 26 by protruding upward through a hole that is formed in holding member 31 separately from the holes for brushes 32a and 32b.

Switch 70 is positioned below guide 13. Switch 70 is disposed above holding member 31 and below pressing part 12c of pressing member 12. In other words, switch 70 is put between holding member 31 and pressing part 12c. Switch 70 has a first terminal and a second terminal. When pressing force is applied to the switch, the first terminal and the second terminal electrically connect together. The first terminal of switch 70 is electrically connected to reference electrode part 60.

Preferably, switch 70 is an electronic component that decreases in resistance value in response to reception of pressing force. Examples of such an electronic component include push switches, pressure sensors, and membrane switches. For example, if a push switch is used as switch 70, switch 70 can generate a click feel when switch 70 is pressed. For example, if a pressure sensor is used as switch 70, switch 70 can output an electric signal in response to pressing force applied to switch 70. For example, if a membrane switch is used as switch 70, switch 70 can control an amount of movement of pressing member 12 in the up-down direction.

Pressing electrode part 80 is an electric conductor held on the lower surface of holding member 31. Pressing electrode part 80 is disposed between reference electrode part 60 and holding electrode elements 32 in a rotating direction. Pressing electrode part 80 is electrically connected to the second terminal of switch 70. Thus, pressing electrode part 80 electrically connects to reference electrode part 60 through switch 70 when the first terminal and the second terminal of the switch are electrically connected together.

[Configuration of Detection Unit 200]

With reference to FIGS. 4 to 8, detection unit 200 will be described. FIG. 6 is a schematic view of detection unit 200. FIG. 7 is a cross-sectional view taken along line Y-Y in FIG. 6. FIG. 8 is a schematic view illustrating a cross section of the display apparatus including input device 1000. A portion of the figure illustrating input unit 100 is equivalent to a cross-sectional view taken along line X-X in FIG. 3.

As shown in FIG. 6, detection unit 200 includes first detection electrode part 40 and second detection electrode part 90. First detection electrode part 40 and second detection electrode part 90 are formed in electrode substrate 52 (see FIG. 8). Electrostatic capacitance of detection unit 200 changes by operation of input unit 100.

First detection electrode part 40 includes detection electrode element 41, detection electrode element 42, detection electrode element 43, and reception electrode part 44. Detection electrode element 41 has reception electrode 41a and transmission electrode 41b. Reception electrode 41a and transmission electrode 41b are electrodes having electric conductivity. Reception electrode 41a is electrically insulated from transmission electrode 41b. Reception electrode 41a is formed into a ring and is disposed above transmission electrode 41b. An insulating layer such as air, a resin, and glass is disposed between reception electrode 41a and transmission electrode 41b. In input device 1000, electrode substrate 52 described later serves as the insulating layer. In other words, electrode substrate 52 is disposed between reception electrode 41a and transmission electrode 41b. The electrostatic capacitance between reception electrode 41a and transmission electrode 41b changes by rotation of rotary part 11 in input unit 100.

Detection electrode element 42 has reception electrode 42a and transmission electrode 42b. Reception electrode 42a and transmission electrode 42b are electrodes having electric conductivity. Reception electrode 42a is electrically insulated from transmission electrode 42b. Reception electrode 42a is formed into a ring and is disposed above transmission electrode 42b. An insulating layer such as air, a resin, and glass is disposed between reception electrode 42a and transmission electrode 42b. In input device 1000, electrode substrate 52 described later serves as the insulating layer. In other words, electrode substrate 52 is disposed between reception electrode 42a and transmission electrode 42b. The electrostatic capacitance between reception electrode 42a and transmission electrode 42b changes by rotation of rotary part 11 in input unit 100.

Detection electrode element 43 has reception electrode 43a and transmission electrode 43b. Reception electrode 42a and transmission electrode 42b are electrodes having electric conductivity. Reception electrode 43a is electrically insulated from transmission electrode 43b. Reception electrode 43a is formed into a ring and is disposed above transmission electrode 43b. An insulating layer such as air, a resin, and glass is disposed between reception electrode 43a and transmission electrode 43b. In input device 1000, electrode substrate 52 described later serves as the insulating layer. In other words, electrode substrate 52 is disposed between reception electrode 43a and transmission electrode 43b.

Electrostatic capacitance between transmission electrode 43b and reception electrode 43a changes when switch 70 is pressed. Switch 70 is pressed by pressing part 12c when pressing member 12 is pressed. In other words, the electrostatic capacitance between transmission electrode 43b and reception electrode 43a changes when pressing member 12 is pressed.

Reception electrode part 44 is a benchmark against which detection electrode element 41, detection electrode element 42, and detection electrode element 43 judge detection. Reception electrode part 44 is a conductive electrode disposed to face reference electrode part 60 (see FIG. 4). Reception electrode part 44 is, for example, electrically connected to a ground and has ground potential.

In this way, first detection electrode part 40 is configured to detect rotation and pressing by the respective electrodes (detection electrode element 41 or detection electrode element 42, and detection electrode element 43) that are electrically isolated from each other. This reduces an error in detecting rotation or pressing. First detection electrode part 40 has detection electrode element 41 and detection electrode element 42 and is thus able to output t an electric signal in response to a direction of rotation of rotary part 11. Hence, if an electric signal is output to indicate rotation of rotary part 11, first detection electrode part 40 may have any one of detection electrode element 41 and detection electrode element 42.

Reception electrodes 41*a*, 42*a*, 43*a* and transmission electrodes 41*b*, 42*b*, 43*b* may be metal electrodes containing a metal such as copper, silver, aluminum, or gold, may be made of a conductive metallic oxide such as indium tin oxide (ITO) or a conductive organic material, or may be transparent electrodes containing, for example, a carbon material such as graphene.

As shown in FIG. 8, substrate 50 includes cover 51 and electrode substrate 52. Cover 51 has a first surface and a second surface. The first surface of cover 51 faces holding electrode part 30. The second surface is a back side of the first surface and is positioned below the second surface. Cover 51 has hardness higher than or substantially equal to hardness of electrode substrate 52 and has translucency throughout at least first region A that faces main body 12*a* of pressing member 12. Electrode substrate 52 is, for example, a film that has hardness substantially equal to the hardness of cover 51 or lower than hardness of electrode substrate 52 and has translucency throughout at least first region A that faces main body 12*a* of pressing member 12. In other words, substrate 50 is configured such that light is allowed to pass through at least first region A from a lower surface to an upper surface. In the upper surface of electrode substrate 52, reception electrodes 41*a*, 42*a*, 43*a* are formed. In the lower surface of electrode substrate 52, transmission electrodes 41*b*, 42*b*, 43*b* are formed.

Electrode substrate 52 may be made up of a plurality of laminated films or be one film. If the electrode substrate is a plurality of films, reception electrodes 41*a*, 42*a*, 43*a* may not be formed in an uppermost surface, and transmission electrodes 41*b*, 42*b*, 43 may not be formed in a lowermost surface.

Electrostatic capacitance of second detection electrode part 90 changes when an object comes into contact with or approaches pressing member 12. Examples of the object include fingers of human beings and robot arms. Second detection electrode part 90 is formed in a part of electrode substrate 52 that is within first region A facing main body 12*a* of pressing member 12. Second detection electrode part 90 has optical transparency. Second detection electrode part 90 and first detection electrode part 40 are formed on the same plane, but may be formed on different planes. Second detection electrode part 90 has four electrodes that are electrically isolated from one another and that are disposed in the shape of a cross. The four electrodes of the second detection electrode part each include reception electrode 90*a* and transmission electrode 90*b* and are disposed in electrode substrate 52. Reception electrode 90*a* is formed into a ring and is disposed above transmission electrode 90*b*. In other words, electrode substrate 52 is disposed as an insulating layer between reception electrode 90*a* and transmission electrode 90*b*. Electrostatic capacitance between reception electrode 90*a* and transmission electrode 90*b* changes when an object comes into contact with or approaches pressing member 12.

A degree of the optical transparency of second detection electrode part 90 is satisfactory if second detection electrode part 90 formed in electrode substrate 52 allows light incident from a place downward of electrode substrate 52 to be incident on pressing member 12. With proviso that the optical transparency described above is satisfied, second detection electrode part 90 may be metal electrodes containing a metal such as copper, silver, aluminum, or gold, may be made of a conductive metallic oxide such as indium tin oxide (ITO) or a conductive organic material, or may be transparent electrodes containing, for example, a carbon material such as graphene, for example. If the second detection electrode part is made up of metal electrodes, the metal electrodes are preferably formed by using any one of directions of forming a metal into fine lines, forming a metal into fine mesh lines, and blackening fine lines made of a metal.

[Operation of Input Device 1000]

Input device 1000 is configured such that the electrostatic capacitances between the reception electrodes and the respective transmission electrodes change in response to corresponding actions, i.e., rotation of rotary part 11, pressing of pressing member 12, and coming into contact with or approaching pressing member 12. First, change in electrostatic capacitance in response to the rotation of rotary part 11 will be described.

Rotary part 25 rotates by rotation of rotary part 11. Rotary electrode element 26 is held in the lower surface of rotary part 25 (see FIG. 5). Thus, rotary electrode element 26 rotates together with rotary part 11. Inner peripheral part 26*b* of rotary electrode element 26 is put into contact with brush 60*a* of reference electrode part 60 (FIG. 4). Outer peripheral part 26*a* of rotary electrode element 26 is put into contact with brush 32*a* and brush 32*b* of holding electrode elements 32.

Since outer peripheral part 26*a* of rotary electrode element 26 has cutouts formed at regular intervals, the rotation of rotary electrode element 26 puts body 60*b* and body 32*c* into alternate states of electrical conduction and electrical isolation. The rotation of the rotary electrode element also puts body 60*b* and body 32*d* into alternate states of electrical conduction and electrical isolation.

The change in electrical state between body 60*b* and body 32*c* and the change in electrical state between body 60*b* and body 32*d* differ from each other when rotary part 11 rotates in a first rotating direction as well as when rotary part 11 rotates in a second rotating direction. The first rotating direction and the second rotating direction are directions opposite to each other.

Reception electrode 41*a* faces body 32*d*. Thus, the electrostatic capacitance between reception electrode 41*a* and transmission electrode 41*b* changes in response to a change in the electrical state of body 32*d*. Reception electrode 42*a* faces body 32*c*. Thus, the electrostatic capacitance between reception electrode 42*a* and transmission electrode 42*b* changes in response to a change in the electrical state of body 32*c*. The change in electrical state between body 60*b* and body 32*c* differs from the change in electrical state between body 60*b* and body 32*d*. As a result, the change in electrostatic capacitance between reception electrode 42*a* and transmission electrode 42*b* differs from the change in electrostatic capacitance between reception electrode 41*a* and transmission electrode 41*b*.

Next, change in electrostatic capacitance in response to the pressing of pressing member 12 will be described. When pressing member 12 is pressed downward, pressing part 12*c* presses switch 70. As a result, reference electrode part 60 electrically connects to pressing electrode part 80. In other words, reference electrode part 60 and pressing electrode part 80 are put into a state of electrical conduction when pressing member 12 is pressed and are put into a state of electrical isolation when pressing member 12 is not pressed. Reception electrode 43*a* faces pressing electrode part 80. Thus, the electrostatic capacitance between reception electrode 43*a* and transmission electrode 43*b* changes in response to a change in the electrical state of pressing electrode part 80.

Next, change in electrostatic capacitance when an object comes into contact with or approaches pressing member 12 will be described. When the object comes into contact with or approaches main body 12a of pressing member 12, the electrostatic capacitance between reception electrode 90a and transmission electrode 90b in second detection electrode part 90, which is disposed to face main body 12a, changes. In other words, the change in electrostatic capacitance when an object comes into contact with or approaches pressing member 12 is detected based on a principle similar to the principle of touch sensor.

In this way, input device 1000 allows the occurrence of a change in the electrostatic capacitances between the reception electrodes and the respective transmission electrodes in response to corresponding actions, i.e., rotation of rotary part 11, pressing of pressing member 12, and an object's coming into contact with or approaching pressing member 12. Thus, input device 1000 is able to output an electric signal in response to a change in any of these electrostatic capacitances.

In input device 1000, substrate 50 transmits light through at least first region A (see FIG. 8) that faces main body 12a of pressing member 12. Hence, when pressing member 12 is viewed from a point upward of pressing member 12, an object below substrate 50 can be viewed.

Input device 1000 includes second detection electrode part 90 disposed to face pressing member 12. Second detection electrode part 90 is designed to transmit light. Thus, input device 1000 allows a touch input or a hover input with pressing member 12 while enabling viewing of an object below substrate 50.

Input device 1000 is configured to let reference electrode part 60 and pressing electrode part 80 electrically connect to each other when pressing member 12 is pressed downward and thereby provides a change in the electrostatic capacitance of first detection electrode part 40. Thus, input device 1000 allows a pressing input as well as a rotational input while enabling viewing of an object below substrate 50. In input device 1000, detection electrode element 41 or detection electrode element 42 is formed on a plane where detection electrode element 43 is formed. This configuration eliminates the need for the disposition of another circuit board used to detect pressing and hence contributes to reductions in size and thickness.

In input device 1000, switch 70 used to electrically connect reference electrode part 60 and pressing electrode part 80 together by pressing is disposed adjacent to an outer edge of pressing member 12. In particular, switch 70 is disposed at a place that is nearer to rotary part 11 than main body 12a, which is visible from a point upward of input device 1000, is. As a result, input device 1000 prevents switch 70 from obstructing viewing of an object below substrate 50 when pressing member 12 is viewed from a point upward of pressing member 12 and thus provides improved visibility.

[Configuration of Display Apparatus 2000]

Figure 9:
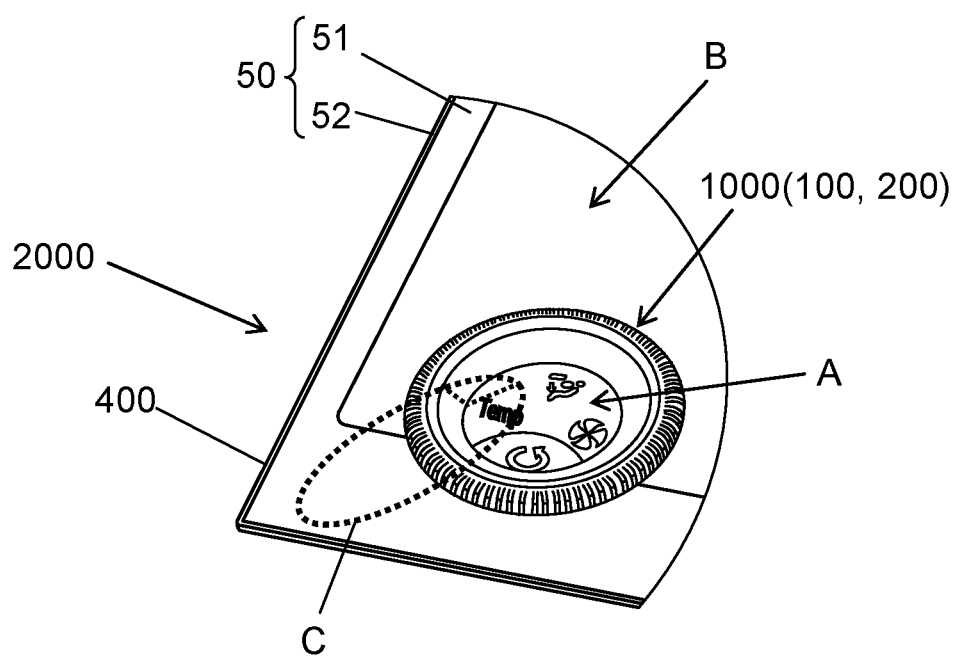
FIG. 9 is a view illustrating an operation of the display apparatus.
Figure 10:
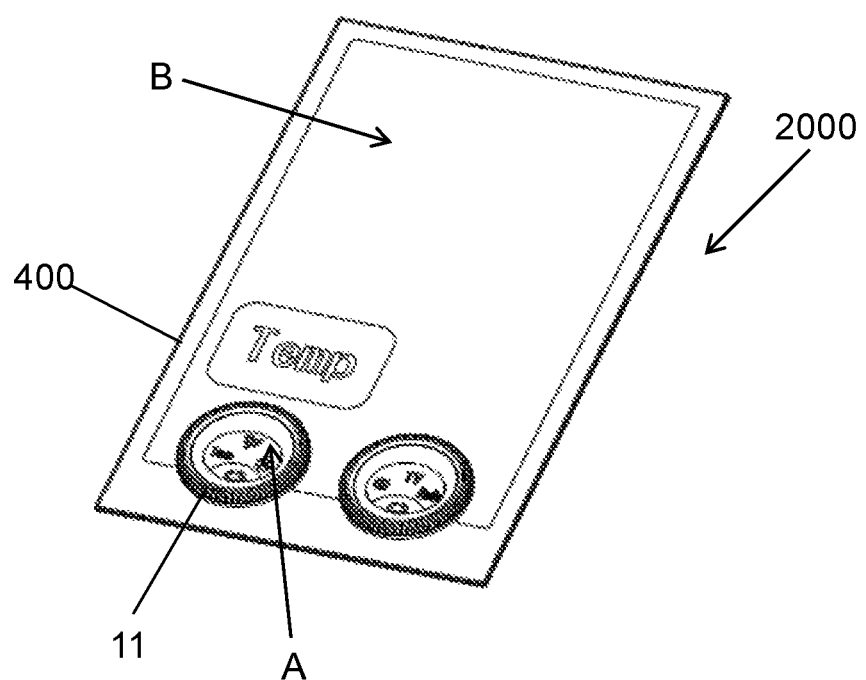
FIG. 10 is a view illustrating an operation of the display apparatus.
Figure 11:
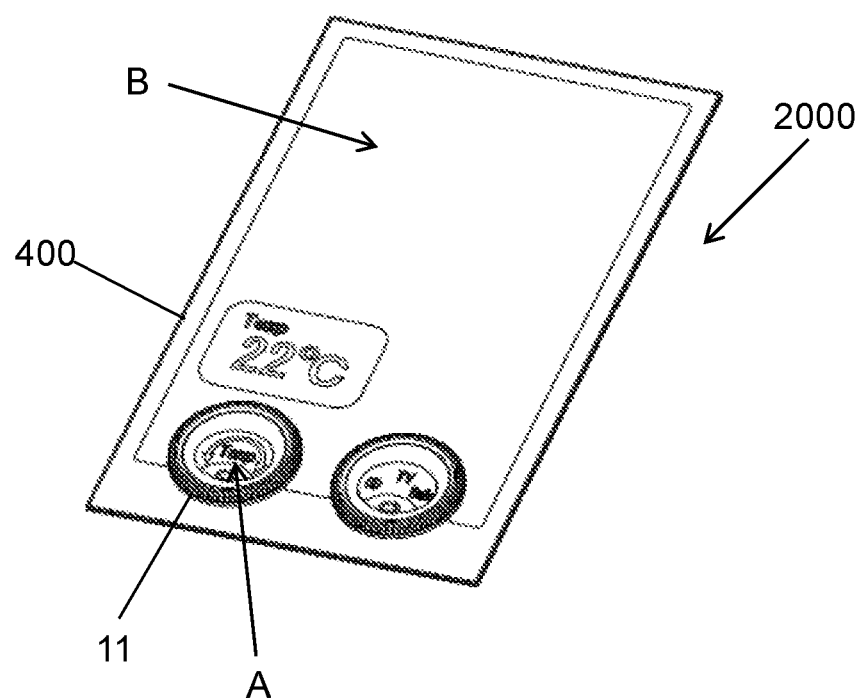
FIG. 11 is a view illustrating an operation of the display apparatus.

With reference to FIG. 2 and FIGS. 8 to 11, display apparatus 2000 including input device 1000 will be described. FIG. 8 is a schematic view illustrating a cross section of display apparatus 2000. FIG. 9 is a view illustrating an operation of display apparatus 2000. FIGS. 10 and 11 are views illustrating an operation of the display apparatus. As shown in FIG. 2, display apparatus 2000 includes input device 1000, display 400, and controller 500.

Input device 1000 includes input units 100, detection units 200, and fastening members 300. Substrate 50 for detection units 200 is made up of a transparent touch screen having cover 51. Substrate 50 is formed larger than input units 100. In other words, input device 1000 allows light to pass through each pressing member 12 and second region B positioned outside each input unit 100. Fastening members 300 are disposed between input units 100 and respective detection units 200 to hold input units 100 and detection units 200. Detection units 200 are electrically connected to controller 500.

Display 400 is, for example, made up of a liquid crystal display, an organic electroluminescence (EL) display, or a transparent display. Display 400 is disposed below input device 1000. Thus, a content shown in display 400 is visible from a point upward of display apparatus 2000 through each first region A and second region B. Portions of display 400 at places corresponding to first regions A and second region B may be portions of an identical display or may be portions of different displays. Display 400 is electrically connected to controller 500.

Controller 500 is electrically connected to detection units 200 and display 400. Controller 500 detects a change in the electrostatic capacitance of each detection unit 200 to determine an action (rotation, pressing, or contact or approach) input to input unit 100. Controller 500 controls the content shown in display 400 in response to the input action.

[Example Operation of Display Apparatus 2000]

With reference to FIGS. 9 and 11, an example operation of display apparatus 2000 will be described. FIGS. 10 and 11 are views illustrating an operation of display apparatus 2000.

When finger C of an operator, as shown in FIG. 9, comes into contact with or approaches 'Temp' displayed in first region A, controller 500, as shown in FIG. 10, displays 'Temp', which is in first region A and selected by the operator, in second region B. This configuration prevents a display content ('Temp' in this example) corresponding to an area selected by finger C of the operator from being hidden behind finger C of the operator. In other words, the content shown in the area selected by finger C of the operator is displayed at a visible place (second region B in this example) in display 400, and display apparatus 2000 of the present disclosure thereby averts an input error.

If the operator performs a pressing action in this condition, controller 500 determines, for example, that the content selected by the operator has been fixed and changes content displayed in first region A and second region B (see FIG. 11). In an example shown in FIG. 11, controller 500 changes content shown on display 400 to a temperature setting screen. On the temperature setting screen, a relationship between rotating directions of rotary part 11 and rise and fall in temperature is displayed in first region A, and a current set temperature is displayed in second region B. The operator can change the set temperature by turning rotary part 11.

In this way, a display area of display apparatus 2000 is divided into first regions A for input device 1000 and second region B. Controller 500 controls content displayed in each first region A and second region B. This enables the operator to operate display apparatus 2000 with improved facility.

Controller 500 does not necessarily display a content identical to a content selected in first region A in second region B. A content based on a content selected in first region A may be displayed in second region B. For example, folders may be displayed in first region A, and details of a selected folder may be displayed in second region B. For example, icons may be displayed in first region A, and a description of a selected icon may be displayed in second region B.

(Conclusion)

Input device 1000 according to the present disclosure includes rotary part 11 having an opening, pressing member 12 overlapping the opening of rotary part 11 in a plan view, rotary electrode part 20 including a first electrode element (rotary electrode element 26), and holding electrode part 30 including a second electrode element (holding electrode elements 32). The pressing member transmits light through first region A overlapping the opening of the rotary part in the plan view. The rotary electrode part rotates in response to rotation of rotary part 11. At least part (brush 32a/brush 32b in the present disclosure) of the second electrode element (holding electrode elements 32) facing rotary electrode part 20. The second electrode element (holding electrode elements 32) is configured to be brought into contact with and separated from the first electrode element (rotary electrode element 26) by rotation of rotary electrode part 20. The input device further includes first detection electrode part 40 facing holding electrode part 30 and substrate 50 in which first detection electrode part 40 is disposed. First detection electrode part 40 includes a first reception electrode (reception electrode 41a/reception electrode 42a) overlapping the second electrode element (holding electrode elements 32) in the plan view and a first transmission electrode (transmission electrode 41b/transmission electrode 42b) overlapping the first reception electrode (reception electrode 41a/reception electrode 42a) in the plan view.

Electrostatic capacitance between the first reception electrode (reception electrode 41a/reception electrode 42a) and the first transmission electrode (transmission electrode 41b/transmission electrode 42b) changes by the rotation of rotary electrode part 20.

Substrate 50 and pressing member 12 transmit light through first region A.

Input device 1000 according the present disclosure also includes reference electrode part 60 configured to electrically connect to holding electrode part 30 through rotary electrode part 20 and pressing electrode part 80 configured to be electrically connected to reference electrode part 60 when pressing member 12 is pressed in a first direction that runs from a first surface of substrate 50 facing holding electrode part 30 to a second surface of the substrate opposite to the first surface (a direction from up to down). First detection electrode part 40 further includes a second reception electrode (reception electrode 43a) overlapping pressing electrode part 80 in the plan view and a second transmission electrode (transmission electrode 43b) overlapping the second reception electrode (reception electrode 43a) in the plan view. Electrostatic capacitance between the second reception electrode (reception electrode 43a) and the second transmission electrode (transmission electrode 43b) changes when pressing member 12 is pressed downward.

Input device 1000 according to the present disclosure further includes switch 70 configured to electrically connect reference electrode part 60 to pressing electrode part 80 when pressing member 12 is pressed downward.

Pressing member 12 includes main body 12a that transmits light and pressing part 12c protruding from main body 12a. Switch 70 is disposed below pressing part 12c of pressing member 12.

Input device 1000 according to the present disclosure further includes second detection electrode part 90 that is disposed in substrate 50 so as to overlap pressing member 12 in the plan view. Second detection electrode part 90 detects whether or not an object (e.g., finger C) has come into contact with or approached pressing member 12.

INDUSTRIAL APPLICABILITY

An input device according to the present disclosure has an effect of enabling light incident from a point farther in a first direction than the input device to be transmitted to a point farther in a second direction than the input device. Thus, the input device can be usefully applied to various electronic apparatuses and other equipment.

REFERENCE MARKS IN THE DRAWINGS

11: rotary part
12: pressing member
12a: main body
12b: holder
12c: pressing part
13: guide
20: rotary electrode part
25: rotary part
25a: uneven area
25b: resin
26: rotary electrode element (first electrode element)
26a: outer peripheral part
26b: inner peripheral part
30: holding electrode part
31: holding member
32: holding electrode element (second electrode element)
32a: brush
32b: brush
32c: body
32d: body
33: click spring
33a: contact pressure part
40: first detection electrode part
41: detection electrode element
41a: reception electrode (first reception electrode)
41b: transmission electrode (first transmission electrode)
42: detection electrode element
42a: reception electrode (first reception electrode)
42b: transmission electrode (first transmission electrode)
43: detection electrode element
43a: reception electrode (second reception electrode)
43b: transmission electrode (second transmission electrode)
44: reception electrode part
50: substrate
51: cover
52: electrode substrate
60: reference electrode part
60a: brush
60b: body
70: switch
80: pressing electrode part
90: second detection electrode part
90a: reception electrode
90b: transmission electrode
100: input unit
200: detection unit
300: fastening member
400: display
500: controller
1000: input device
2000: display apparatus
A: first region
B: second region
C: finger

The invention claimed is:
1. An input device comprising:
a holding member;
a guide;
a rotary part having an opening;

a pressing member overlapping the opening of the rotary part in plan view, the pressing member being configured to transmit light through a first region overlapping the opening of the rotary part in plan view, the pressing member including a main body that transmits light, a pressing part protruding from the main body in plan view and a holder protruding from the main body in plan view, the holder disposed opposite the pressing part with respect to the main body and held between the holding member and the guide;

a rotary electrode part including a first electrode element, the rotary electrode part being configured to rotate in response to rotation of the rotary part;

a holding electrode part including a second electrode element, at least part of the second electrode element facing the rotary electrode part, the second electrode element being configured to be brought into contact with and separated from the first electrode element by rotation of the rotary electrode part;

a first detection electrode part facing the holding electrode part;

a substrate in which the first detection electrode part is disposed; and a switch disposed above the holding member and below the pressing part of the pressing member, and disposed at a region outside the main body of the pressing member in plan view, wherein:

the first detection electrode part includes:

a first reception electrode overlapping the second electrode element in plan view; and a first transmission electrode overlapping the first reception electrode in plan view, electrostatic capacitance between the first reception electrode and the first transmission electrode changes by the rotation of the rotary electrode part, and the substrate and the pressing member transmit light through the first region.

2. The input device according to claim 1, further comprising:

a reference electrode part configured to electrically connect to the holding electrode part through the rotary electrode part; and a pressing electrode part configured to be electrically connected to the reference electrode part when the pressing member is pressed, wherein:

the first detection electrode part further includes:

a second reception electrode overlapping the pressing electrode part in plan view; and a second transmission electrode overlapping the second reception electrode in plan view, and electrostatic capacitance between the second reception electrode and the second transmission electrode changes when the pressing member is pressed.

3. The input device according to claim 2, wherein:

the switch is configured to electrically connect the reference electrode part to the pressing electrode part when the pressing member is pressed.

4. The input device according to claim 1, further comprising a second detection electrode part that is disposed in the substrate so as to overlap the pressing member in plan view, wherein the second detection electrode part detects whether or not an object has come into contact with or approached the pressing member.

* * * * *